US012761265B2

(12) United States Patent
Hara et al.

(10) Patent No.: US 12,761,265 B2
(45) Date of Patent: Oct. 13, 2026

(54) MEASUREMENT METHOD AND MEASUREMENT DEVICE

(71) Applicants: Kabushiki Kaisha Toshiba, Tokyo (JP); Toshiba Electronic Devices & Storage Corporation, Tokyo (JP)

(72) Inventors: Takuma Hara, Kanazawa Ishikawa (JP); Tatsuya Ohguro, Kanazawa Ishikawa (JP); Shigeru Nakajima, Komatsu Ishikawa (JP); Katsura Miyashita, Naka Kanagawa (JP); Yasuhisa Oomuro, Komatsu Ishikawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 289 days.

(21) Appl. No.: 18/237,292

(22) Filed: Aug. 23, 2023

(65) Prior Publication Data

US 2024/0280628 A1 Aug. 22, 2024

(30) Foreign Application Priority Data

Feb. 16, 2023 (JP) ................................ 2023-022699

(51) Int. Cl.
*G01R 31/26* (2020.01)

(52) U.S. Cl.
CPC ......... *G01R 31/2621* (2013.01); *G01R 31/26* (2013.01)

(58) Field of Classification Search
CPC ............................ G01R 31/26; G01R 31/2621
See application file for complete search history.

(56) References Cited

U.S. PATENT DOCUMENTS

2006/0139138 A1* 6/2006 Watanabe ........... H01L 23/5227 336/200
2021/0270886 A1* 9/2021 Lichtenwalner ... G01R 31/2621
2022/0360186 A1* 11/2022 Plum ..................... H02M 1/348
2023/0318592 A1* 10/2023 Takinami ............. H03K 17/661

FOREIGN PATENT DOCUMENTS

CN 109425811 A * 3/2019 ......... G01R 31/2632
JP S63-081281 A 4/1988
JP 2010-200585 A 9/2010
JP 2016-086585 A 5/2016

* cited by examiner

*Primary Examiner* — Judy Nguyen
*Assistant Examiner* — Adam S Clarke
(74) *Attorney, Agent, or Firm* — Knobbe, Martens, Olson & Bear, LLP

(57) ABSTRACT

A measurement method includes determining a first relationship by measuring a reverse recovery charge of a semiconductor element at a plurality of conditions of a measurement device. The measurement device has mutually-different parasitic inductances at the plurality of conditions. The semiconductor element includes a diode component. The first relationship is between the parasitic inductance and a measured value of the reverse recovery charge. The method includes estimating a true value of the reverse recovery charge when the parasitic inductance is zero based on the first relationship.

8 Claims, 14 Drawing Sheets

ON-PERIOD T1

REFLUX PERIOD T2

ATTENUATION PERIOD T3

RECOVERY PERIOD T4

MEASUREMENT METHOD AND MEASUREMENT DEVICE

CROSS-REFERENCE TO RELATED APPLICATIONS

This application is based upon and claims the benefit of priority from Japanese Patent Application No. 2023-022699, filed on Feb. 16, 2023; the entire contents of which are incorporated herein by reference.

FIELD

Embodiments relate to a measurement method and a measurement device.

BACKGROUND

In a semiconductor element that includes a diode component, the reverse recovery charge (Qrr) that flows when the applied voltage is switched from the forward direction to the reverse direction is an important parameter that greatly affects the switching loss of the semiconductor element. It is therefore desirable to accurately measure the reverse recovery charge of the semiconductor element.

DETAILED DESCRIPTION

In general, according to one embodiment, a measurement method includes determining a first relationship by measuring a reverse recovery charge of a semiconductor element at a plurality of conditions of a measurement device. The measurement device has mutually-different parasitic inductances at the plurality of conditions. The semiconductor element includes a diode component. The first relationship is between the parasitic inductance and a measured value of the reverse recovery charge.

The method includes estimating a true value of the reverse recovery charge when the parasitic inductance is zero based on the first relationship.

In general, according to one embodiment, a measurement device includes a direct current power supply, a switching element, a fixed inductance, and a variable inductance. The direct current power supply is connected to a semiconductor element. The semiconductor element includes a diode component. The switching element is connected in series to the direct current power supply and the semiconductor element. The fixed inductance is connected in parallel to the semiconductor element. The variable inductance is connected in series with a semiconductor element in a circuit. The circuit includes the direct current power supply, the semiconductor element, and the switching element.

First Embodiment

A first embodiment is an embodiment of a measurement device and a measurement method that measure a reverse recovery charge of a semiconductor element including a diode component.

Figure 1A:
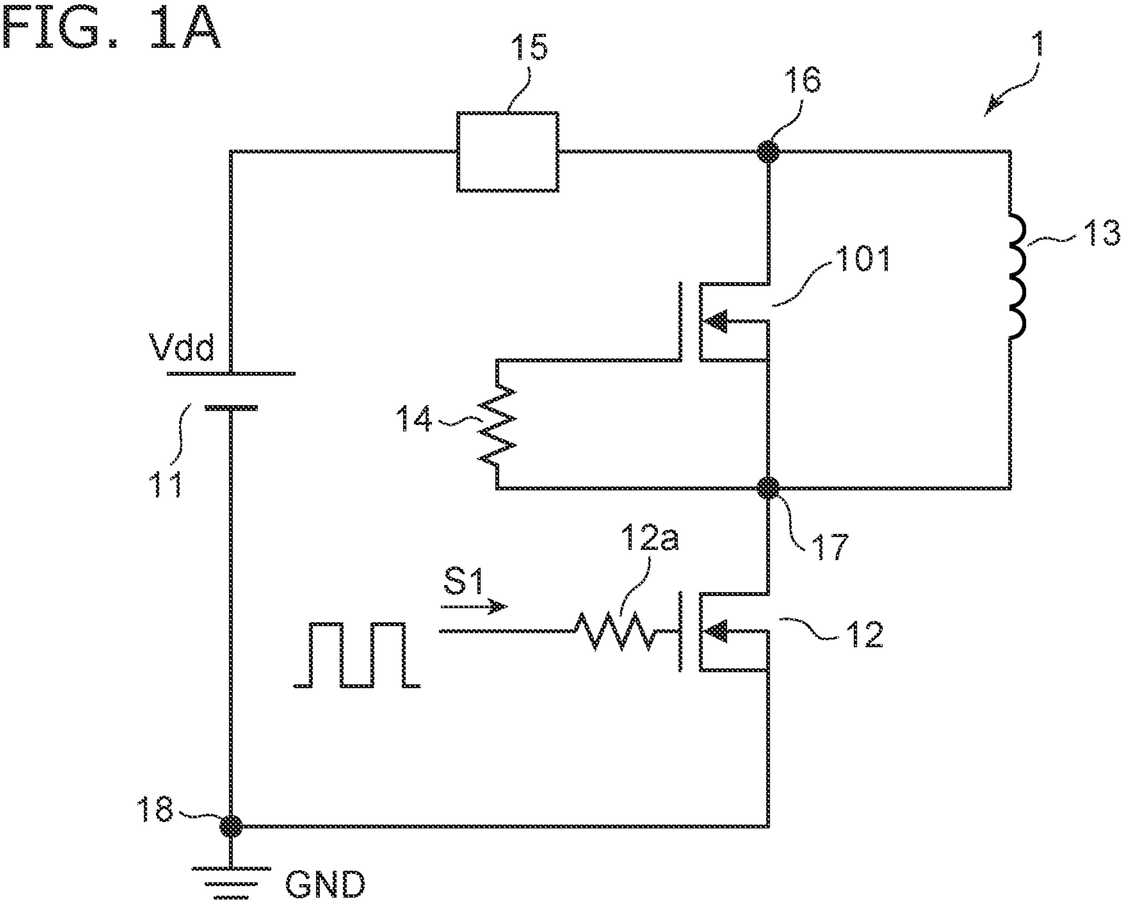
FIG. 1A is a circuit diagram showing a measurement device of the reverse recovery charge according to a first embodiment.
Figure 1B:
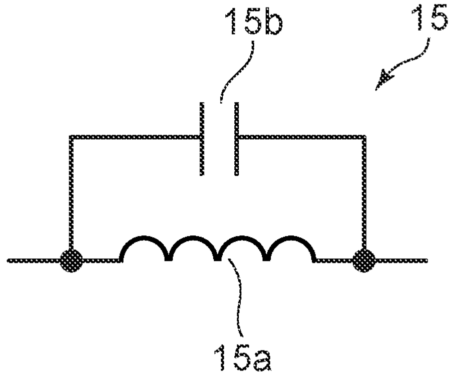
FIG. 1B is a circuit diagram showing a variable inductance shown in FIG. 1A.

Measurement device FIG. 1A is a circuit diagram showing a measurement device of the reverse recovery charge according to the embodiment; and FIG. 1B is a circuit diagram showing a variable inductance shown in FIG. 1A.

As shown in FIG. 1A, the measurement device 1 according to the embodiment measures the reverse recovery charge of a semiconductor element 101. The semiconductor element 101 is a semiconductor element that includes a diode component and is, for example, a MOSFET (Metal-Oxide-Semiconductor Field-Effect Transistor).

The measurement device 1 includes a DC power supply 11, a switching element 12, a fixed inductance 13, a resistance element 14, and a variable inductance 15. The output voltage of the DC power supply 11 is taken as Vdd. The DC power supply 11 is connected in series to the semiconductor element 101. For example, when the semiconductor element 101 is an n-type MOSFET, the cathode of the DC power supply 11 is connected to the drain of the semiconductor element 101. In the specification, "connected" means an electrical connection.

The switching element 12 is connected in series to the semiconductor element 101. For example, the anode of the DC power supply 11 is connected to the source of the switching element 12. The anode of the DC power supply 11 also is connected to a ground potential GND. The drain of the switching element 12 is connected to the source of the semiconductor element 101. A control signal S1 of an arbitrary frequency is input to the control electrode of the switching element 12 via a resistance 12*a*. The control signal S1 is, for example, a square wave. The fixed inductance 13 is connected in parallel with the semiconductor element 101. The resistance element 14 is connected between the source and the gate of the semiconductor element 101.

The variable inductance 15 is connected in series to the semiconductor element 101 to be interposed in the circuit made of the DC power supply 11, the semiconductor element 101, and the switching element 12. For example, the variable inductance is connected between a node 16 and the cathode of the DC power supply 11. The node 16 is the connection point between the cathode of the DC power supply 11, the drain of the semiconductor element 101, and the fixed inductance 13. As shown in FIG. 1B, an inductance component 15*a* and a capacitor component 15*b* are connected in parallel in the variable inductance 15.

The change rate of the current (hereinbelow, called the "current change rate di/dt") flowing in the semiconductor element 101 can be controlled by adjusting the value of the resistance 12*a* connected to the control electrode of the switching element 12 in the measurement device 1.

Semiconductor Element

The semiconductor element 101 that is the measurement object of the embodiment will now be described.

Figure 2:
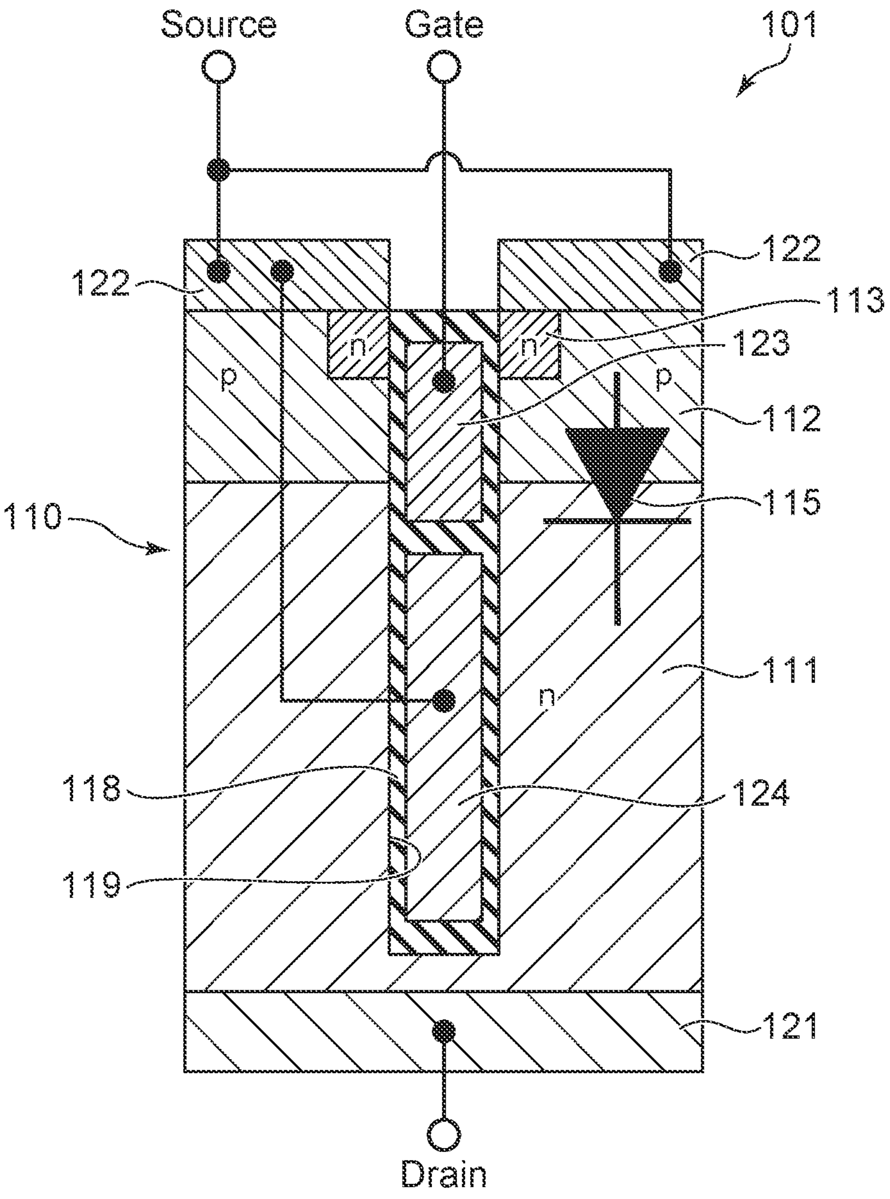
FIG. 2 is a cross-sectional view showing the semiconductor element that is the measurement object of the first embodiment.

FIG. 2 is a cross-sectional view showing the semiconductor element that is the measurement object of the embodiment.

FIG. 2 shows an example of the semiconductor element; according to the embodiment, the semiconductor element that is the measurement object is not limited to the example shown in FIG. 2; and it is sufficient to be a semiconductor element that includes a diode component.

As shown in FIG. 2, the semiconductor element 101 includes a semiconductor part 110. A drain electrode 121 is located on the lower surface of the semiconductor part 110; and a source electrode 122 is located on the upper surface of the semiconductor part 110. A trench 119 is formed in the semiconductor part 110 from the upper surface side; and an insulating body 118 is located inside the trench 119. A gate electrode 123 and a field plate electrode (a FP electrode) 124 are located in the insulating body 118. The gate electrode 123 is located higher than the FP electrode 124. The gate electrode 123 is connected to a gate pad (not illustrated) located on the upper surface of the semiconductor part 110. The FP electrode 124 is connected to the source electrode 122.

In the semiconductor part 110, an n-type drain layer 111 is provided; a p-type base layer 112 is located on the drain layer 111; and an n-type source layer 113 is located on a portion of the base layer 112. The drain layer 111 is connected to the drain electrode 121; and the base layer 112 and the source layer 113 are connected to the source electrode 122. The gate electrode 123 and the FP electrode 124 face the semiconductor part 110 via the insulating body 118. A diode 115 is formed at the p-n junction surface between the base layer 112 and the drain layer 111.

Measurement Method

An operation of the measurement device 1 according to the embodiment, that is, a measurement method of the reverse recovery charge according to the embodiment, will now be described.

First, the basic concept of the embodiment will be described.

Figure 3:
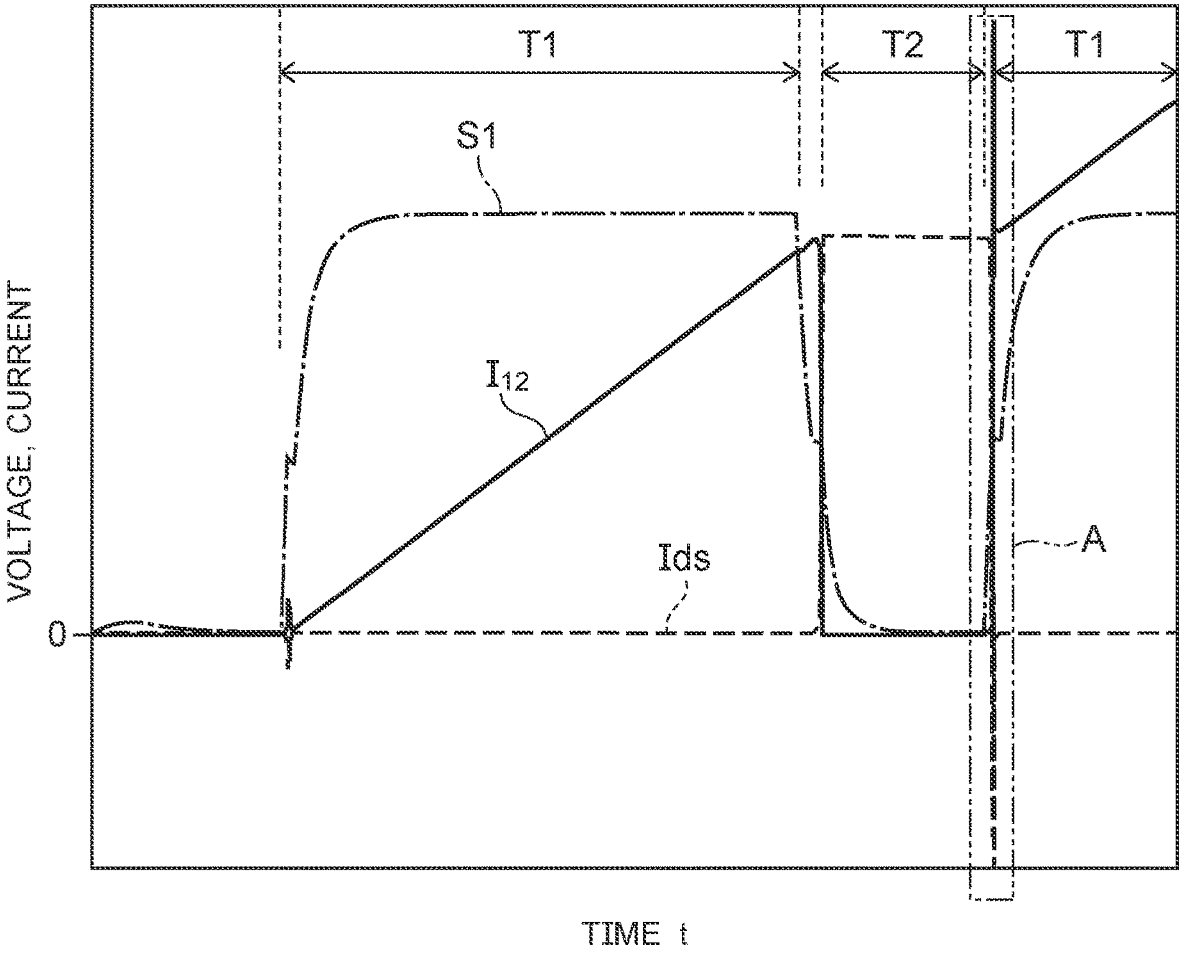
FIG. 3 is a graph showing an operation of a measurement circuit, in which the horizontal axis is time, and the vertical axis is the voltage or current.

FIG. 3 is a graph showing an operation of a measurement circuit, in which the horizontal axis is time, and the vertical axis is the voltage or current.

Figure 4:
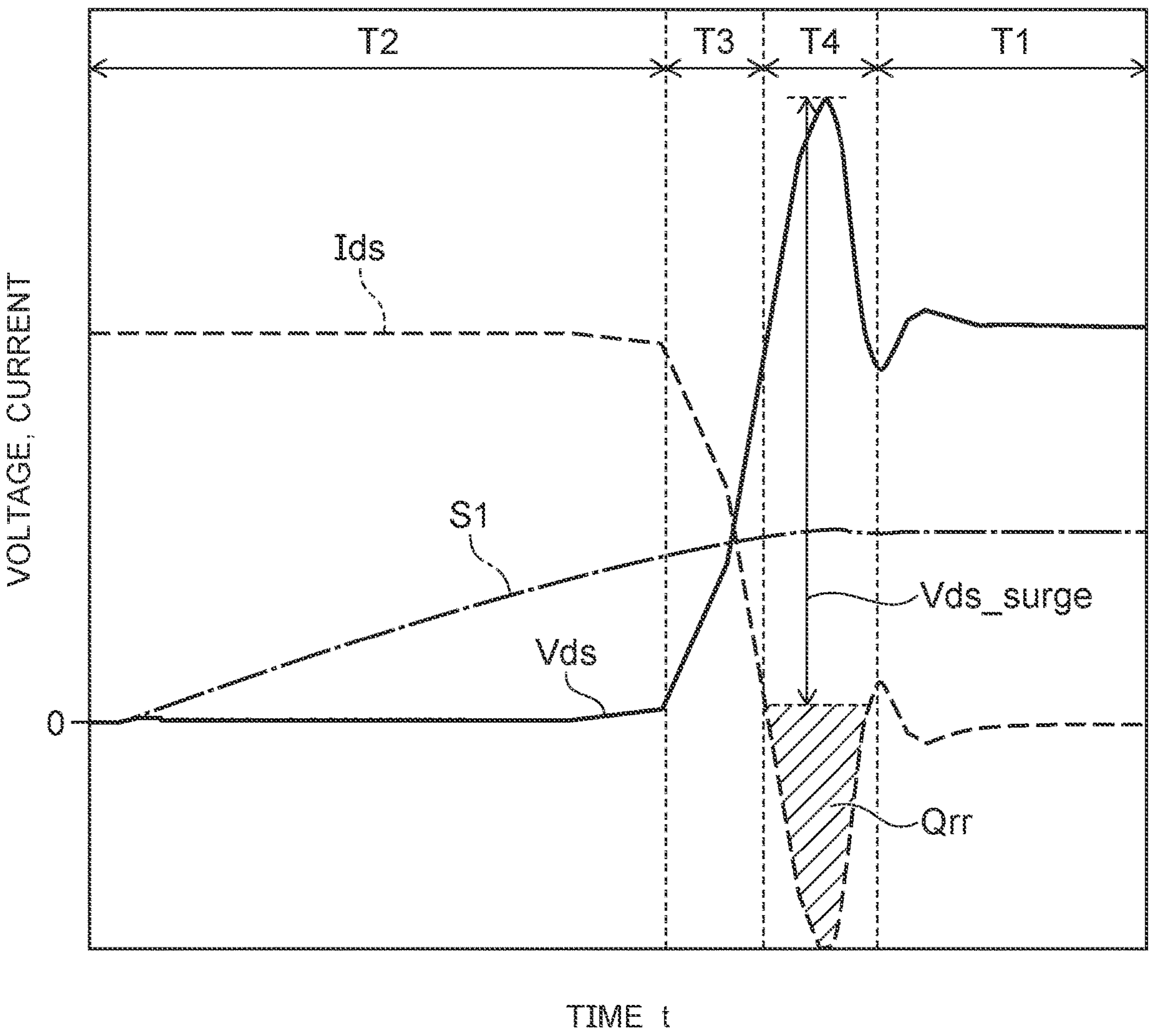
FIG. 4 is an enlarged view of region A of FIG. 3.

FIG. 4 is an enlarged view of region A of FIG. 3.

FIGS. 5A to 5D show the flow of the current in the measurement device.

In FIGS. 5A to 5D, the arrow illustrates the current flowing in the entire measurement device 1.

Figure 5A:
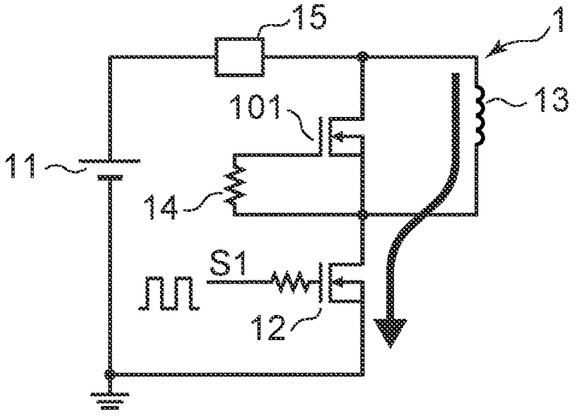
FIGS. 5A to 5D show the flow of the current in the measurement device.

In an on-period T1 of the switching element 12 as shown in FIGS. 3 and 5A, the control signal S1 is the high level (e.g., 10 V), and the switching element 12 conducts. Accordingly, the current flows in the path made of the DC power supply 11, the variable inductance 15, the fixed inductance 13, and the switching element 12. A current $I_{12}$ that flows in the switching element 12 is smoothly increased by the operation of the variable inductance 15 and the fixed inductance 13. At this time, substantially no current flows in the semiconductor element 101. In other words, a current Ids that flows between the drain and source of the semiconductor element 101 is substantially 0.

Figure 5B:
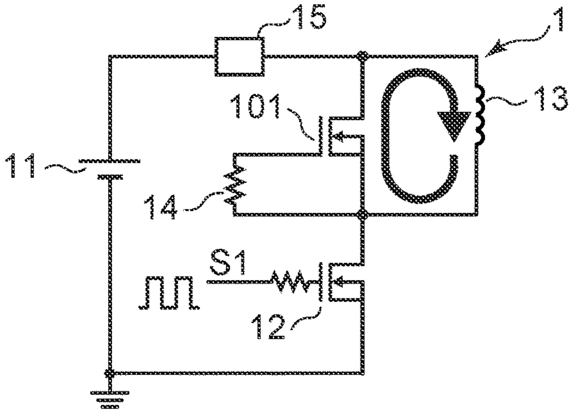

In a reflux period T2 of the semiconductor element 101 as shown in FIGS. 3 and 5B, the control signal S1 is the low level (e.g., 0 V), and the switching element 12 does not conduct. At this time, a return current flows in the path made of the fixed inductance 13 and the semiconductor element 101 due to the operation of the fixed inductance 13. The current Ids flows in the semiconductor element 101 from the source toward the drain.

In other words, a forward current flows in the diode 115. Accordingly, electrons and holes are injected into the semiconductor part 110 of the semiconductor element 101. At the end of the reflux period T2, the control signal S1 is re-switched to the high level; and the potential of the control signal S1 starts to rise.

Figure 5C:
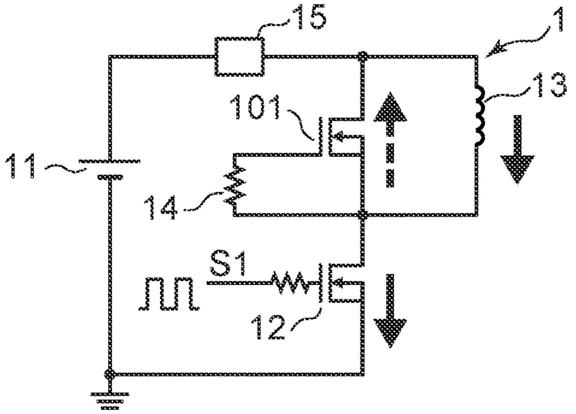

In an attenuation period T3 of the semiconductor element 101 as shown in FIGS. 4 and 5C, the potential of the control signal S1 exceeds the threshold of the switching element 12; and the switching element 12 re-conducts. Accordingly, a current flows in the path made of the DC power supply 11, the variable inductance 15, the fixed inductance 13, and the switching element 12. At this time, a drain-source voltage Vds of the semiconductor element 101 rises, and the current Ids decreases. The decrease rate of the current Ids at this time is the current change rate di/dt.

Figure 5D:
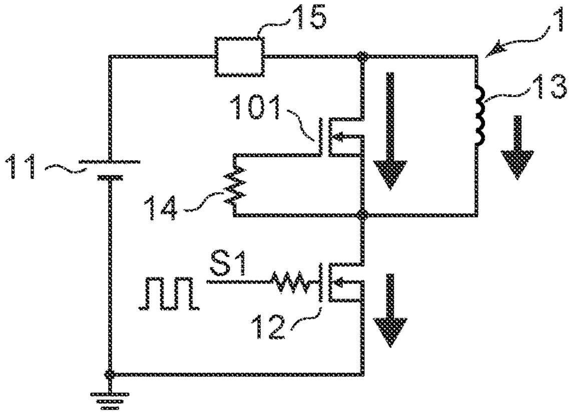

In a recovery period T4 of the semiconductor element 101 as shown in FIGS. 4 and 5D, the electrons and holes that are injected into the semiconductor part 110 of the semiconductor element 101 are discharged from the semiconductor part 110 while the current flows in the path made of the DC power supply 11, the variable inductance 15, the fixed inductance 13, and the switching element 12; and a reverse current flows in the diode 115. The current is a reverse recovery current; and the time integration of the reverse recovery current is a reverse recovery charge Qrr.

In FIG. 4, the area of the oblique hatching region corresponds to the reverse recovery charge Qrr. The reverse recovery charge Qrr can be measured by measuring the current Ids. The reverse recovery charge Qrr of the semiconductor element is dependent on the current change rate di/dt and generally increases as the current change rate di/dt increases. According to investigations by the inventors, the measured value of the reverse recovery charge Qrr is affected not only by the current change rate di/dt but also by a parasitic inductance para_L of the measurement device. The parasitic inductance of the measurement device 1 is the sum total of the inductance caused by the parts of the measurement device 1 other than the semiconductor element 101. More specifically, as the current change rate and the parasitic inductance increase, oscillations caused by the parasitic inductance undesirably occur in the reverse recovery current; and the reverse recovery charge Qrr is undesirably measured to be excessively large.

Figure 6A:
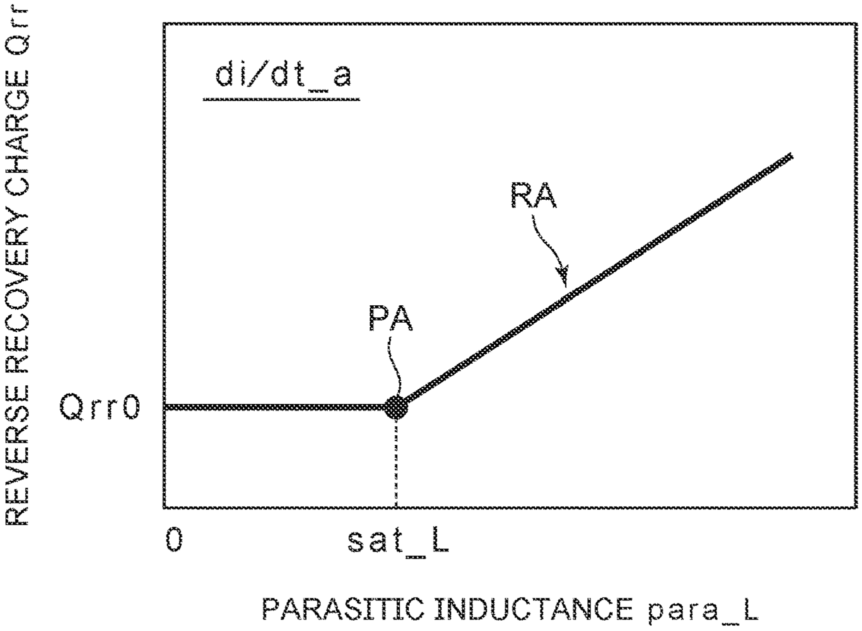
FIG. 6A is a graph showing effects of the parasitic inductance of the measurement device on the measured value of the reverse recovery charge under the condition of a constant current change rate di/dt, in which the horizontal axis is the parasitic inductance, and the vertical axis is the measured value of the reverse recovery charge.
Figure 6B:
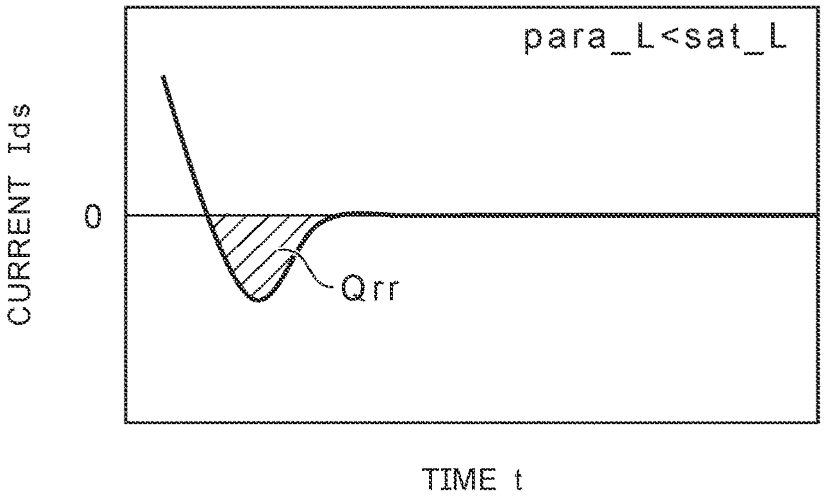
FIGS. 6B and 6C are graphs showing the waveform of the reverse recovery operation, in which the horizontal axis is time, and the vertical axis is the drain current.
Figure 6C:
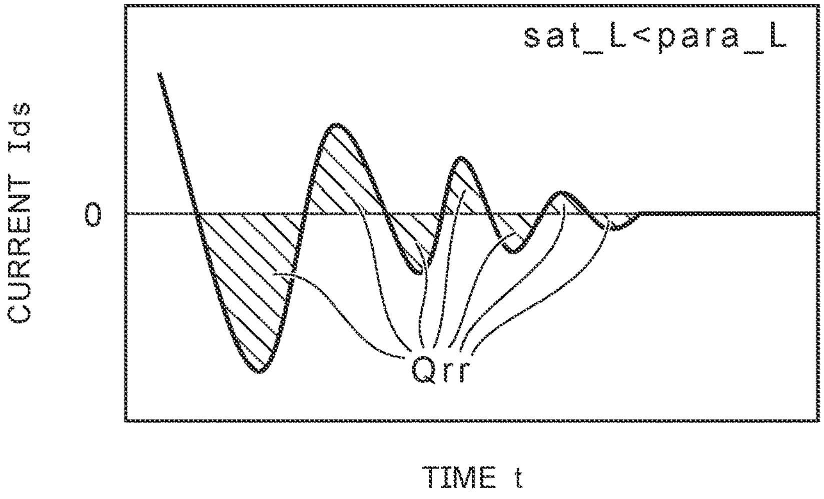

FIG. 6A is a graph showing effects of the parasitic inductance of the measurement device on the measured value of the reverse recovery charge under the condition of a constant current change rate di/dt, in which the horizontal axis is the parasitic inductance, and the vertical axis is the measured value of the reverse recovery charge; and FIGS. 6B and 6C are graphs showing the waveform of the reverse recovery operation, in which the horizontal axis is time, and the vertical axis is the drain current.

As shown in FIG. 6A, in the range in which the parasitic inductance para_L is greater than a threshold, the measured value of the reverse recovery charge Qrr increases as the parasitic inductance para_L increases. On the other hand, in the range in which the parasitic inductance para_L is less than the threshold, the measured value of the reverse recovery charge Qrr is substantially not affected by the parasitic inductance para_L. In the specification, the threshold is called the "saturated parasitic inductance sat_L".

Such behavior of the measured value of the reverse recovery charge Qrr is considered to be due to the following reasons. When the parasitic inductance para_L is not more than the saturated parasitic inductance sat_L as shown in FIG. 6B, the current Ids that flows in the semiconductor element 101 converges within a half period without oscillating, whereas when the parasitic inductance para_L is not less than the saturated parasitic inductance sat_L as shown in FIG. 6C, the current Ids oscillates, and the current continues to flow over multiple periods. Therefore, the charge that flows in the second and subsequent periods also is included in the reverse recovery charge Qrr defined in FIG. 4, and the measured value of the reverse recovery charge Qrr undesirably exceeds the true value.

According to the embodiment, a value Qrr0 of the reverse recovery charge Qrr when the parasitic inductance para_L is zero is determined, and this value Qrr0 is taken to be the true value of the reverse recovery charge Qrr. The value of the reverse recovery charge Qrr that is independent of the parasitic inductance of the measurement device can be determined thereby.

In other words, a relationship RA between the parasitic inductance para_L and the measured value of the reverse recovery charge Qrr is determined as shown in FIG. 6A. Then, an inflection point PA at which the parasitic inductance para_L dependence of the measured value of the reverse recovery charge Qrr discontinuously changes in the relationship RA is determined. The reverse recovery charge Qrr at the inflection point PA is used as the true value Qrr0 of the reverse recovery charge. As described above, the true value Qrr0 of the reverse recovery depends on the constant current change rate di/dt. Thus, the true value Qrr0 of the reverse recovery charge can be extracted for each constant current change rate di/dt.

A method for determining the saturated parasitic inductance sat_L will now be described.

Figure 7A:
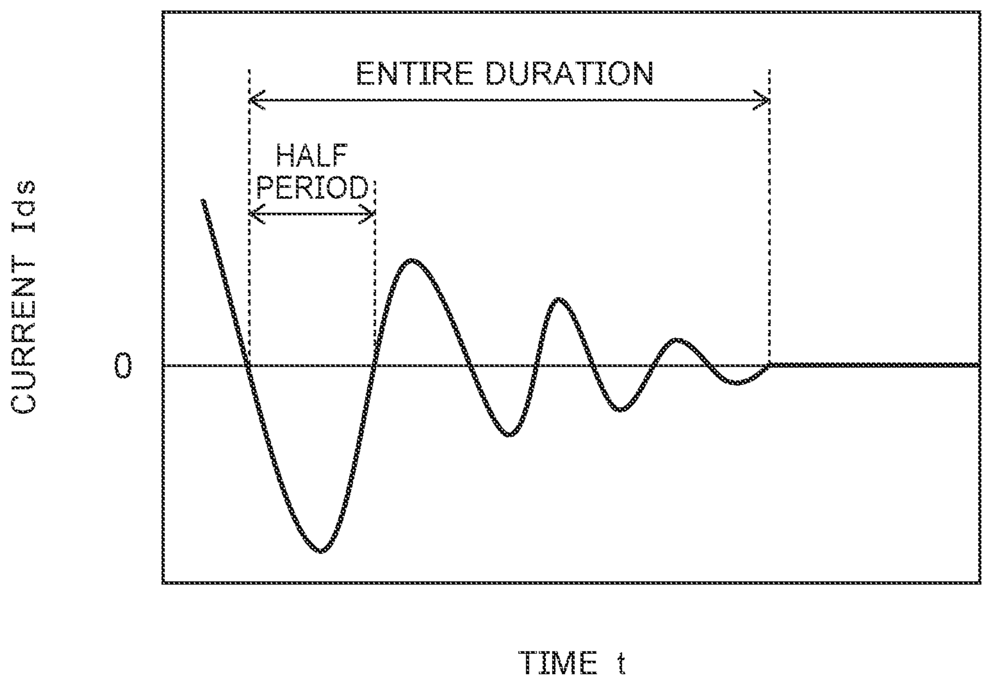
FIG. 7A is a graph showing the reverse recovery operation, in which the horizontal axis is time, and the vertical axis is the current flowing in the semiconductor element.
Figure 7B:
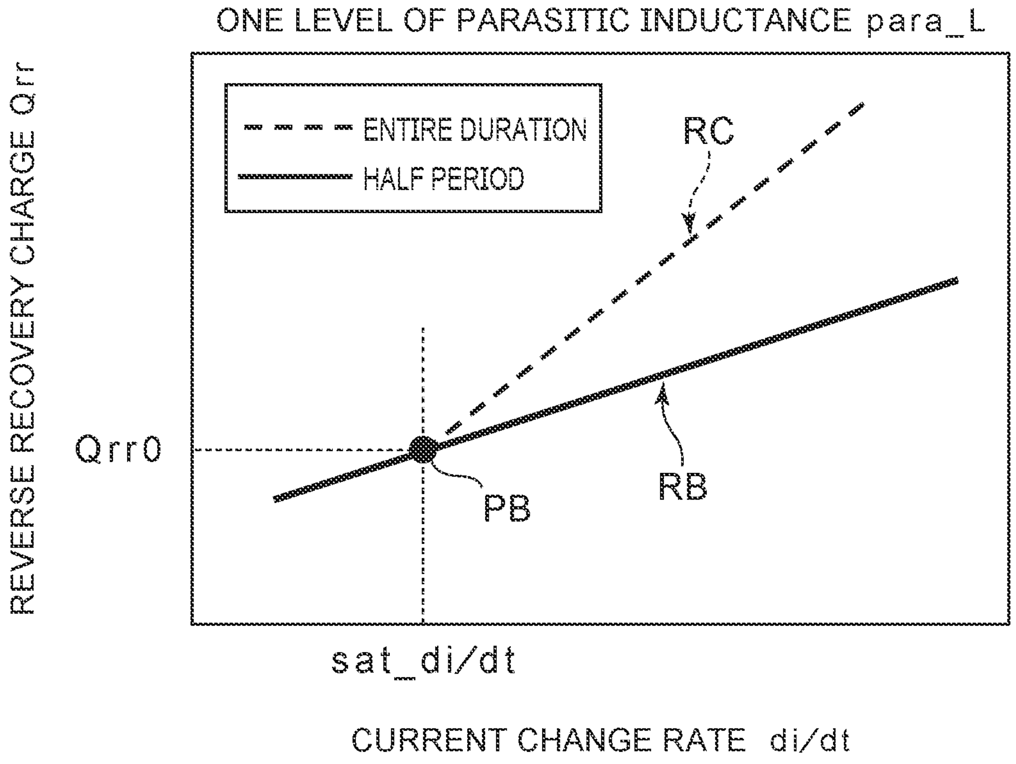
FIG. 7B is a graph showing the effects of the current change rate on the reverse recovery charge for one level of the parasitic inductance para_L, in which the horizontal axis is the current change rate, and the vertical axis is the reverse recovery charge.

FIG. 7A is a graph showing the reverse recovery operation, in which the horizontal axis is time, and the vertical axis is the current flowing in the semiconductor element; and FIG. 7B is a graph showing the effects of the current change rate on the reverse recovery charge for one level of the parasitic inductance para_L, in which the horizontal axis is the current change rate, and the vertical axis is the reverse recovery charge.

Figure 8:
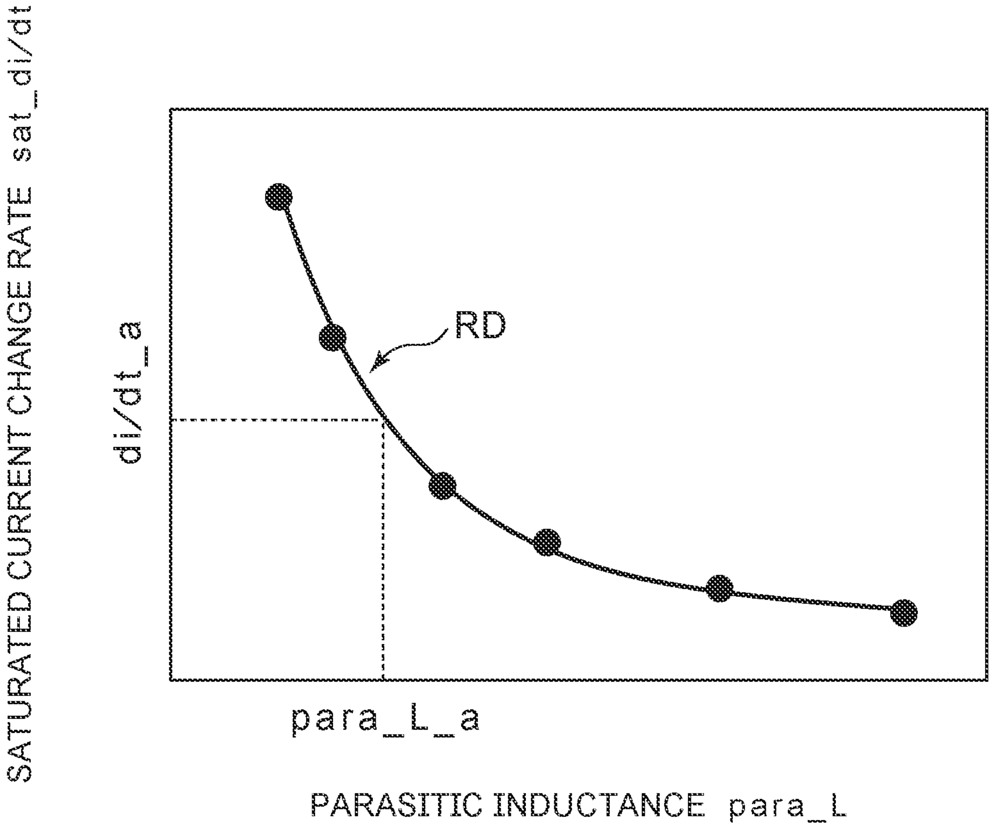
FIG. 8 is a graph showing the relationship between the parasitic inductance and the saturated current change rate, in which the horizontal axis is the parasitic inductance, and the vertical axis is the saturated current change rate.

FIG. 8 is a graph showing the relationship between the parasitic inductance and the saturated current change rate, in which the horizontal axis is the parasitic inductance, and the vertical axis is the saturated current change rate.

Figure 9A:
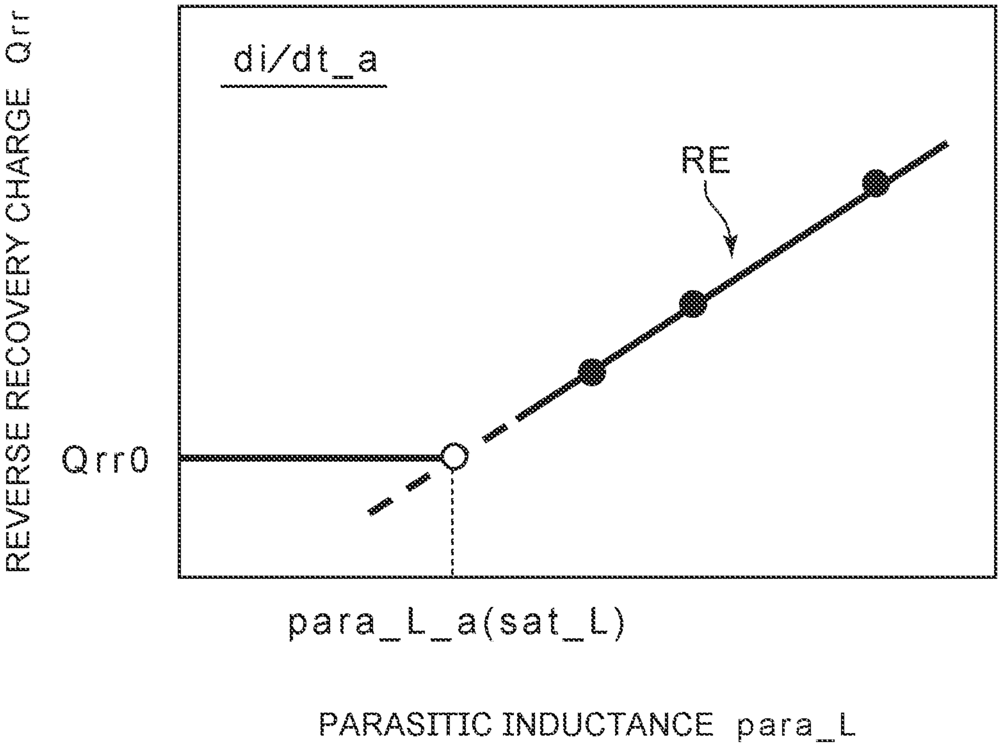
FIG. 9A is a graph showing the relationship between the parasitic inductance and the reverse recovery charge at the same current change rate (di/dt_a), in which the horizontal axis is the parasitic inductance, and the vertical axis is the reverse recovery charge.
Figure 9B:
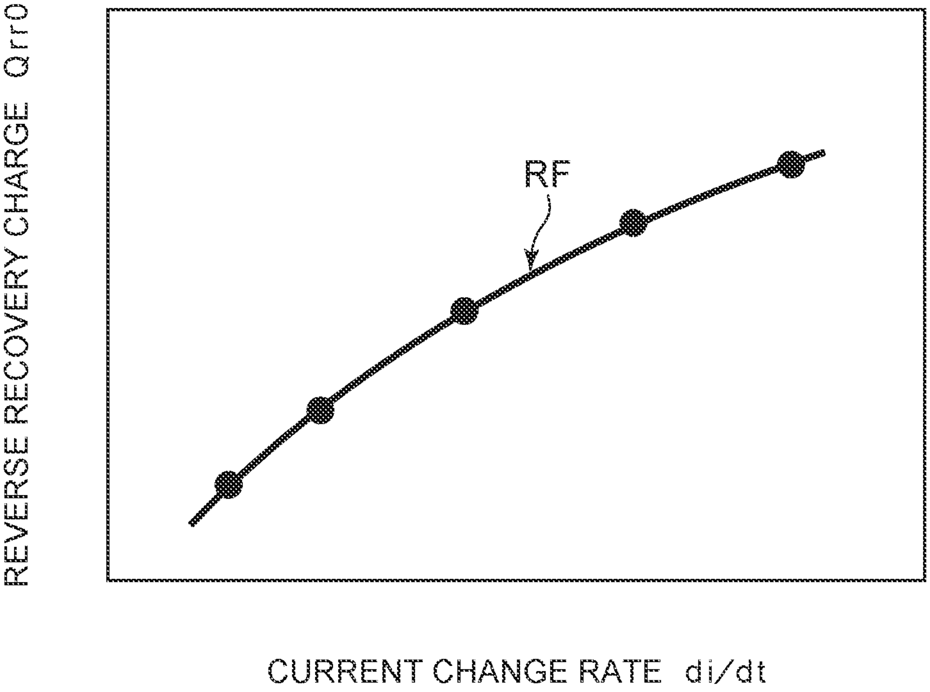
FIG. 9B is a graph showing the relationship between the current change rate and the true value of the reverse recovery charge, in which the horizontal axis is the current change rate, and the vertical axis is the true value of the reverse recovery charge.

FIG. 9A is a graph showing the relationship between the parasitic inductance and the reverse recovery charge at the same current change rate (di/dt_a), in which the horizontal axis is the parasitic inductance, and the vertical axis is the reverse recovery charge; and FIG. 9B is a graph showing the relationship between the current change rate and the true value of the reverse recovery charge, in which the horizontal axis is the current change rate, and the vertical axis is the true value of the reverse recovery charge.

As shown in FIG. 1A, the parasitic inductance para_L of the measurement device 1 is set to an arbitrary value by adjusting the variable inductance 15 of the measurement device 1. Also, the current change rate di/dt is controlled to an arbitrary value by adjusting the value of the resistance 12*a* connected to the control electrode of the switching element 12. The reverse recovery charge Qrr of the semiconductor element 101 is measured in this state.

At this time, as shown in FIG. 7A, the charge amount of the current value integrated over the initial half period of the oscillation of the reverse recovery current is measured, and the charge amount of the absolute value of the current value integrated over the entire duration of the oscillations is measured. The measurement is performed for the set parasitic inductance para_L for multiple levels of the current change rate di/dt. Accordingly, as shown in FIG. 7B, for one level of the parasitic inductance para_L, a relationship RB between the current change rate di/dt and the reverse recovery charge Qrr transferred in the initial half period of the current oscillation is determined, and a relationship RC between the current change rate di/dt and the reverse recovery charge Qrr transferred in the entire duration of the current oscillation is determined.

Then, an intersection PB between the relationship RB and the relationship RC in FIG. 7B is determined. The value of the current change rate di/dt corresponding to the intersection PB is used as the "saturated current change rate sat_di/dt". When the current change rate di/dt is less than the saturated current change rate sat_di/dt, the oscillation of the reverse recovery current converges in a half period as shown in FIG. 6B; when the current change rate di/dt is greater than the saturated current change rate sat_di/dt, the oscillation of the reverse recovery current continues over multiple periods as shown in FIG. 6C; and the saturated current change rate sat_di/dt is the boundary value of these two states.

Then, measurements are performed for multiple levels of the parasitic inductance para_L. Accordingly, the saturated current change rate sat_di/dt is determined at multiple conditions of the measurement device 1 having mutually-different parasitic inductances para_L. A relationship RD between the parasitic inductance and the saturated current change rate is determined as shown in FIG. 8 by plotting the saturated current change rate sat_di/dt corresponding to each parasitic inductance para_L and by connecting these plots with a curve.

Then, the parasitic inductance para_L that corresponds to an arbitrary current change rate di/dt is determined based on the relationship RD. In the example shown in FIG. 8, the parasitic inductance para_L_a that corresponds to the arbitrary current change rate di/dt_a is determined. Because the current change rate di/dt_a in the relationship RD is the saturated current change rate, the parasitic inductance para_L_a that corresponds to the current change rate di/dt_a corresponds to the saturated parasitic inductance sat_L for this current change rate (see FIG. 6A).

Then, as shown in FIG. 9A, the reverse recovery charge Qrr is measured for multiple levels of the parasitic inductance para_L for the current change rate di/dt_a. The reverse recovery charge Qrr at this time is determined for the entire duration of the oscillations of the reverse recovery current. If the relationship between the parasitic inductance para_L and the reverse recovery charge Qrr for the current change rate di/dt_a was already measured to generate FIG. 8, the results can be used.

Thus, a relationship RE between the parasitic inductance para_L and the reverse recovery charge Qrr for the current change rate di/dt_a is determined. The reverse recovery charge Qrr that corresponds to the parasitic inductance para_L_a (the saturated parasitic inductance sat_L) on the straight line or extension line of the straight line representing the relationship RE is the true value Qrr0 of the reverse recovery charge. As described above, the true value Qrr0 of the reverse recovery charge is the reverse recovery charge Qrr when the parasitic inductance para_L of the measurement device 1 is zero. As a result, the true value Qrr0 of the reverse recovery charge for an arbitrary current change rate di/dt is estimated.

The relationship RE shown in FIG. 9A may be determined for multiple levels of the current change rate di/dt; and the results may be plotted and connected with a curve. As shown in FIG. 9B, a relationship RF between the current change rate di/dt and the true value Qrr0 of the reverse recovery charge is acquired thereby. The relationship RF is independent of the parasitic inductance para_L of the measurement device 1. The relationship RF can be used to determine the true value Qrr0 of the reverse recovery charge for an arbitrary current change rate di/dt for which the reverse recovery charge Qrr has not been measured.

Effects

According to the embodiment, the measurement device 1 adjusts the variable inductance 15 to realize multiple levels of the parasitic inductance, at which the reverse recovery charge is measured to determine the true value Qrr0 of the reverse recovery charge when the parasitic inductance of the measurement device 1 is zero. The reverse recovery charge can be accurately measured thereby.

The saturated current change rate sat_di/dt of the reverse recovery current flowing through the semiconductor element 101 is determined by comparing the charge amount transferred in the initial half period and the charge amount transferred in the entire duration of the oscillations; and the saturated parasitic inductance sat_L that corresponds to the saturated current change rate sat_di/dt can be determined. Accordingly, the reverse recovery charge Qrr that corresponds to the saturated parasitic inductance can be determined and used as the true value Qrr0 of the reverse recovery charge.

Second Embodiment

The configurations of the measurement device and the semiconductor element according to the embodiment are similar to those of the first embodiment.

According to the embodiment, the saturated current change rate sat_di/dt is determined differently from the first embodiment.

Measurement Method

Figure 10:
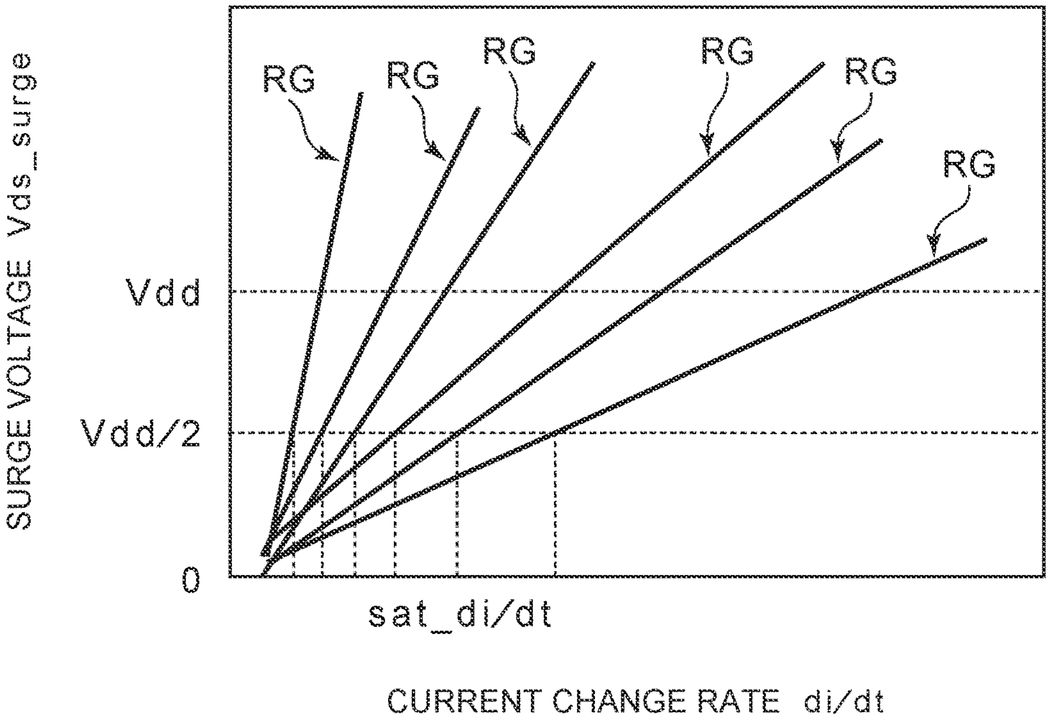
FIG. 10 is a graph showing relationships between the current change rate and the surge voltage according to a second embodiment, in which the horizontal axis is the current change rate, and the vertical axis is the surge voltage.

FIG. 10 is a graph showing relationships between the current change rate and the surge voltage according to the embodiment, in which the horizontal axis is the current change rate, and the vertical axis is the surge voltage.

As shown in FIG. 1A, the parasitic inductance para_L of the measurement device 1 is set to an arbitrary value by adjusting the variable inductance 15 of the measurement device 1. Also, the current change rate di/dt is set to an arbitrary value by adjusting the value of the resistance **12*a* connected to the control electrode of the switching element 12. Then, a surge voltage Vds_surge of the semiconductor element 101 is measured (see FIG. 4**).

As shown in FIG. 10, a relationship RG between the current change rate di/dt and the surge voltage Vds_surge is determined thereby. A plurality of straight lines shown in FIG. 10 represent a plurality of relationships RG at different levels of parasitic inductance para_L. On the other hand, the reference potential is set between the anode potential (GND) and the cathode potential (Vdd) of the DC power supply 11. The reference potential is determined by analysis, and is a potential such that the oscillation of the reverse recovery current continues past a half period when the surge voltage Vds_surge is greater than the reference potential. According to the embodiment, the reference potential is, for example, a voltage (Vdd/2) that is half of the power supply voltage Vdd of the DC power supply 11. Then, the current change rate di/dt that corresponds to the reference potential, i.e., the voltage (Vdd/2) of half of the power supply voltage Vdd of the DC power supply 11, in the relationship RG is used as the saturated current change rate sat_di/dt.

Then, the relationship of the parasitic inductance para_L and the saturated current change rate sat_di/dt is plotted. A graph similar to FIG. 8 is generated thereby, and the relationship RD between the parasitic inductance and the saturated current change rate can be determined.

The subsequent processes are similar to those of the first embodiment. Namely, the parasitic inductance para_L that corresponds to an arbitrary current change rate di/dt is determined based on the relationship RD (see FIG. 8). Then, as shown in FIG. 9A, the reverse recovery charge Qrr is measured for multiple levels of the parasitic inductance para_L for the current change rate di/dt_a. The true value Qrr0 of the reverse recovery charge for the arbitrary current change rate di/dt is estimated thereby.

Effects

According to the embodiment as well, the true value Qrr0 of the reverse recovery charge can be determined similarly to the first embodiment. The reverse recovery charge can be accurately measured thereby. Otherwise, the configuration, the method, and the effects according to the embodiment are similar to those of the first embodiment.

Third Embodiment

The configurations of the measurement device and the semiconductor element according to the embodiment are similar to those of the first embodiment.

According to the embodiment, the saturated current change rate sat_di/dt is determined differently from the first embodiment.

Measurement Method

According to the embodiment, the relationship between the current change rate and the reverse recovery charge shown in FIG. 7B is determined for multiple levels of the parasitic inductance para_L by a method similar to that of the first embodiment. At this time, the relationship RB between the current change rate and the charge amount transferred in the initial half period of the oscillation of the reverse recovery current is determined, and the relationship RC between the current change rate and the charge amount transferred in the entire duration of the oscillations is determined. The current change rate at the intersection PB between the relationship RB and the relationship RC is used as the saturated current change rate sat_di/dt; and the reverse recovery charge Qrr at the intersection PB is used as the true value Qrr0 of the reverse recovery charge.

Then, the saturated current change rate sat_di/dt and the true value Qrr0 of the reverse recovery charge are plotted for the intersections PB determined for multiple levels of the parasitic inductance para_L. The relationship RF such as that shown in FIG. 9B is determined thereby. The relationship RF is used to determine the true value Qrr0 of the reverse recovery charge that corresponds to an arbitrary current change rate di/dt.

Figure 11:
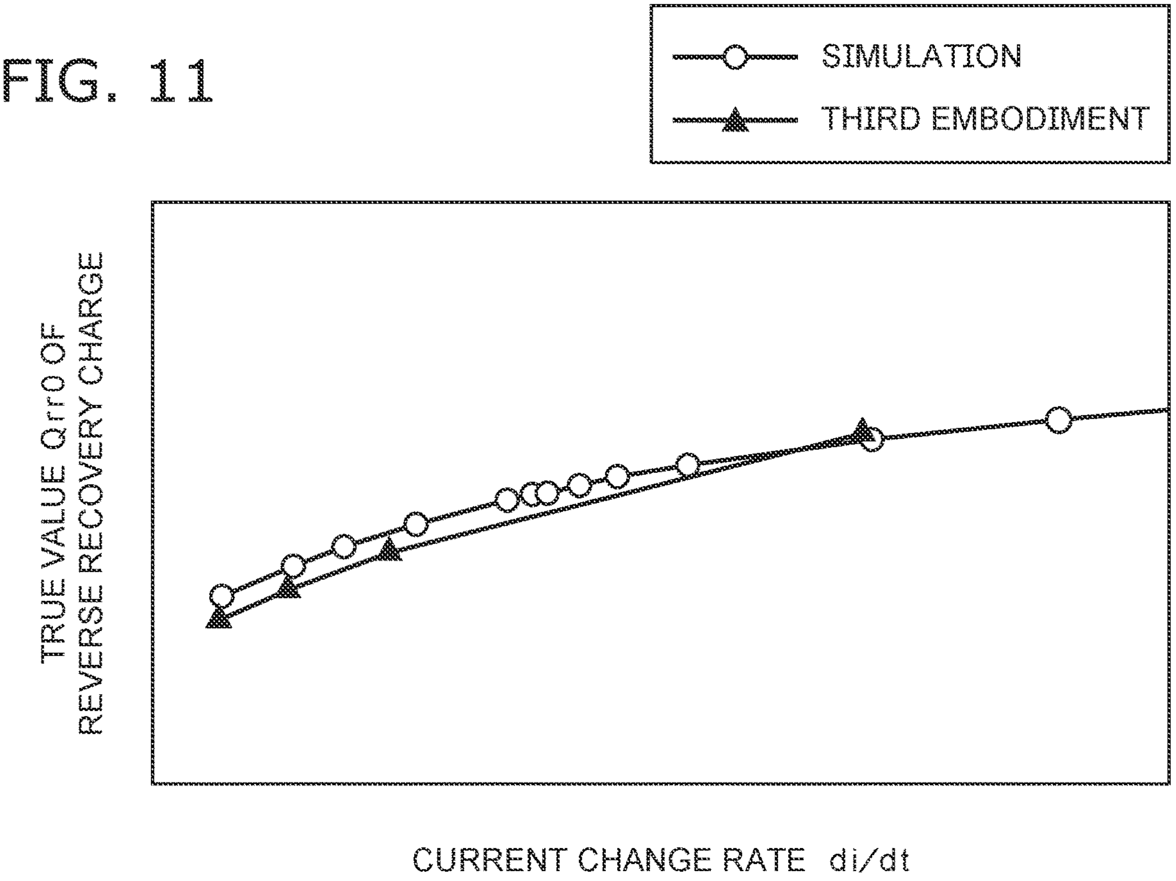
FIG. 11 is a graph comparing the results of a simulation and the results of a third embodiment, in which the horizontal axis is the current change rate, and the vertical axis is the true value of the reverse recovery charge.

FIG. 11 is a graph comparing the results of a simulation and the results of the embodiment, in which the horizontal axis is the current change rate, and the vertical axis is the true value of the reverse recovery charge.

In the simulation, the case which the parasitic inductance para_L is 0 was assumed. Then, reverse recovery charges corresponding to multiple levels of current change rates di/dt were calculated.

As shown in FIG. 11, the true value of the reverse recovery charge determined by the method according to the embodiment substantially matches the true value of the reverse recovery charge determined by the simulation.

Effects

According to the embodiment as well, the true value Qrr0 of the reverse recovery charge can be determined similarly to the first embodiment. The reverse recovery charge can be accurately measured thereby. Otherwise, the configuration, the method, and the effects according to the embodiment are similar to those of the first embodiment.

Fourth Embodiment

The embodiment is a method for further analyzing the true value of the reverse recovery charge determined by the method according to one of the first to third embodiments.

Figure 12A:
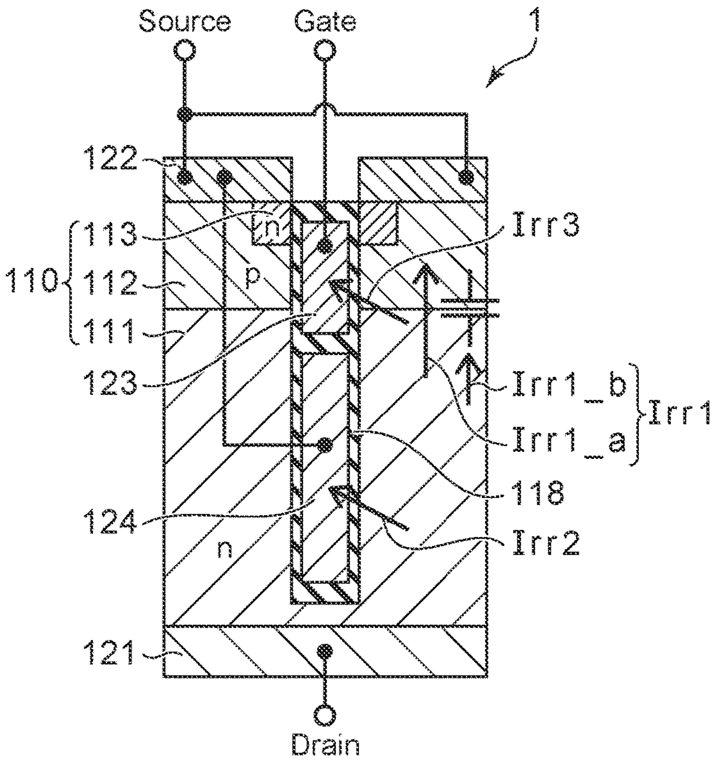
FIG. 12A schematically shows the reverse recovery current inside the semiconductor element.
Figure 12B:
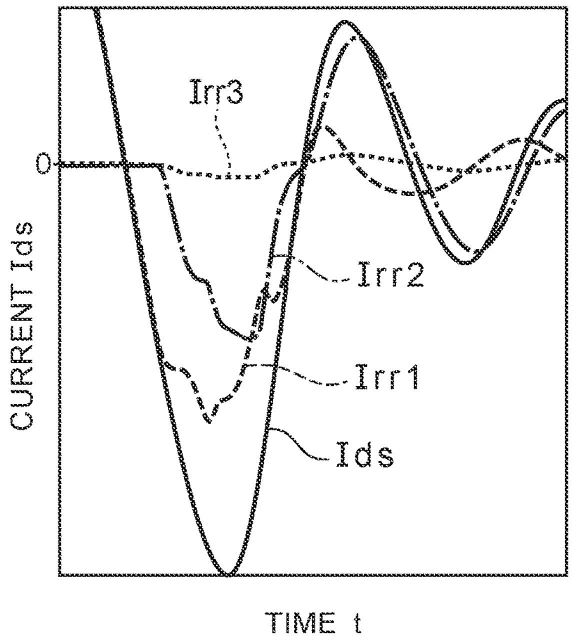
FIG. 12B shows the parts of the reverse recovery current.
Figure 12C:
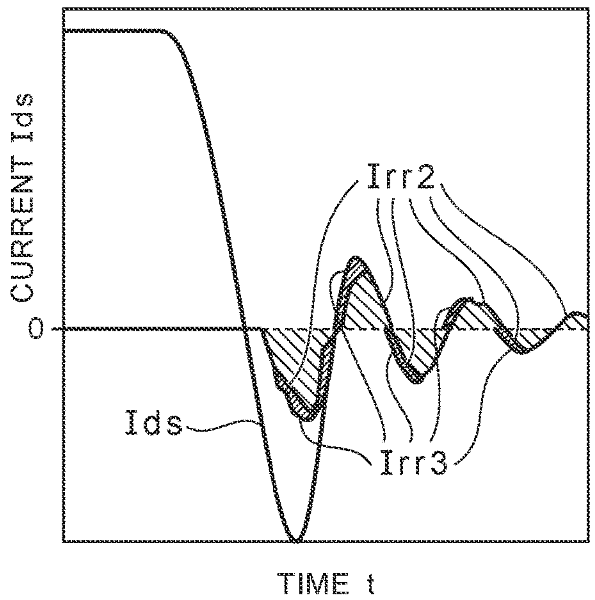
FIG. 12C shows the parts of the reverse recovery current contributing to the boost of the drain-source voltage Vds.

FIG. 12A schematically shows the reverse recovery current inside the semiconductor element; FIG. 12B shows the parts of the reverse recovery current; and FIG. 12C shows the parts of the reverse recovery current contributing to the boost of the drain-source voltage Vds.

As shown in FIG. 12A, the current Ids that flows through the semiconductor element 101 in the reverse recovery operation can be decomposed into the three types of currents of a current Irr1, a current Irr2, and a current Irr3 according to the current path inside the semiconductor element 101.

From outside the semiconductor element 101, the current Irr1 appears to be a current flowing from the drain layer 111 to the base layer 112. The current Irr1 can be further decomposed into a current Irr1_*a* and a current Irr1_b. The current Irr1_*a* corresponds to carriers recombining or being discharged. The current Irr1_b is a current accumulating in the parasitic capacitor formed of the depletion layer interposed between the drain layer 111 and the source layer 113.

The current Irr2 corresponds to the charge accumulating in the parasitic capacitor formed of the insulating body 118 interposed between the drain layer 111 and the FP electrode 124 and appears from outside the semiconductor element 101 to flow from the drain layer 111 to the FP electrode 124.

The current Irr3 is a charge accumulating in the parasitic capacitor formed of the insulating body 118 interposed between the drain layer 111 and the gate electrode 123 and appears from outside the semiconductor element 101 to flow from the drain layer 111 to the gate electrode 123.

The total of the current Irr1_b, the current Irr2, and the current Irr3 contributes to the boost of the drain-source voltage Vds of the semiconductor element 101 and is substantially equal to an output charge amount Qoss between the source and drain of the semiconductor element 101.

According to the embodiment, the output charge amount Qoss is measured for the semiconductor element 101.

Specifically, the integral of a capacitance static characteristic Coss-Vdd is measured up to the power supply voltage Vdd of the DC power supply 11 of the measurement device 1 and used as the output charge amount Qoss. On the other hand, the true value Qrr0 of the reverse recovery charge is determined by a method according to the first to third embodiments. Then, the charge that corresponds to the current Irr1_*a* can be determined by reducing the output charge amount Qoss from the true value Qrr0.

According to the embodiment, the true value Qrr0 of the reverse recovery charge can be separated into the charge caused by recombination or discharge of carriers (corresponding to the current Irr1_*a*) and the charge contributing to the boost of the drain-source voltage Vds (corresponding to the total of the current Irr1_b, the current Irr2, and the current Irr3). Accordingly, the characteristics of the semiconductor element 101 can be analyzed in more detail and used in the development of the semiconductor element 101. Otherwise, the configuration, the method, and the effects according to the embodiment are similar to those of the first embodiment.

Fifth Embodiment

The position at which the variable inductance is located in the measurement device according to the embodiment is different from that of the first embodiment.

Figure 13:
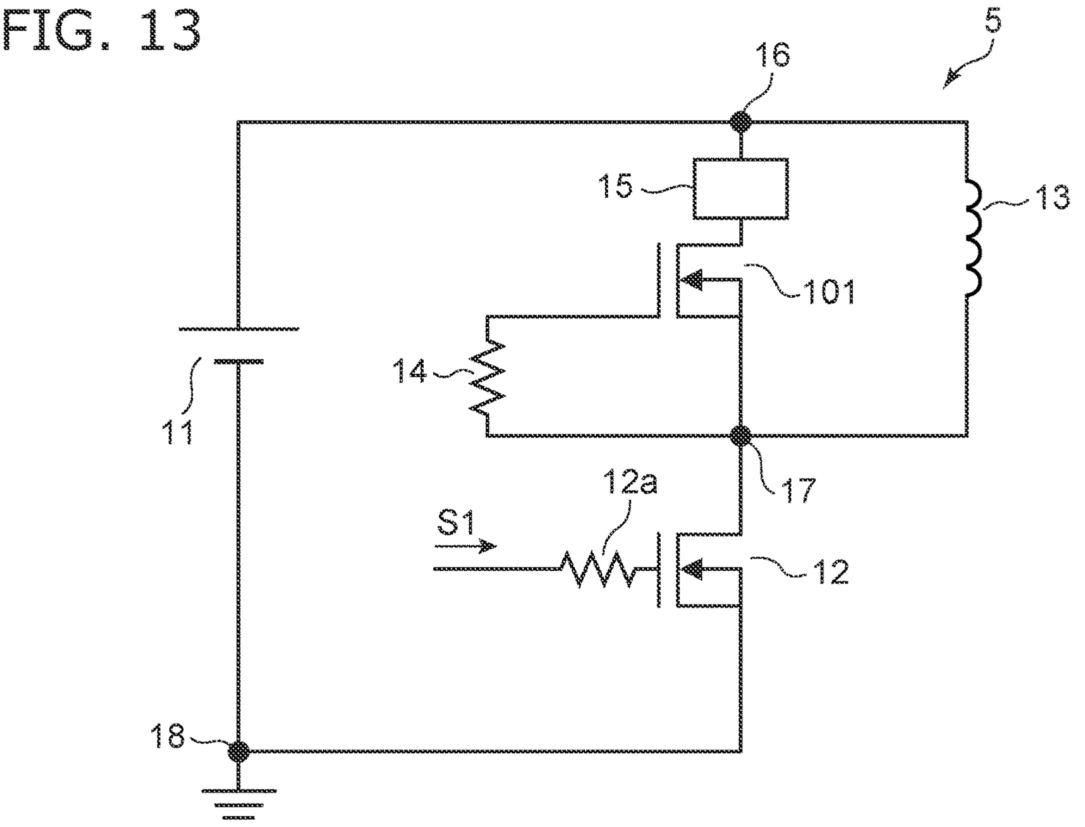
FIG. 13 is a circuit diagram showing the measurement device of the reverse recovery charge according to a fifth embodiment.

FIG. 13 is a circuit diagram showing the measurement device of the reverse recovery charge according to the embodiment.

In the measurement device 5 of the reverse recovery charge according to the embodiment as shown in FIG. 13, the variable inductance 15 is connected between the node 16 and the drain of the semiconductor element 101. The node 16 is the connection point between the cathode of the DC power supply 11, the drain of the semiconductor element 101, and the fixed inductance 13. Otherwise, the configuration, the method, and the effects according to the embodiment are similar to those of the first embodiment.

Sixth Embodiment

The position at which the variable inductance is located in the measurement device according to the embodiment is different from that of the first embodiment.

Figure 14:
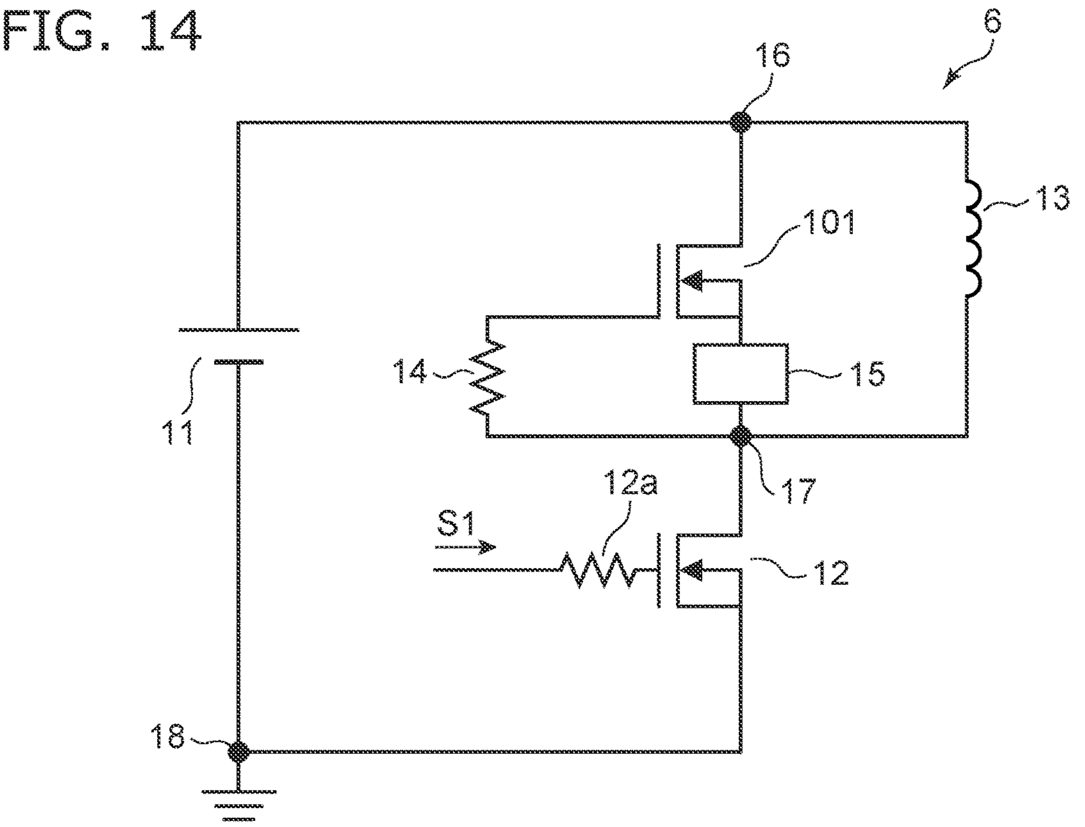
FIG. 14 is a circuit diagram showing the measurement device of the reverse recovery charge according to a sixth embodiment.

FIG. 14 is a circuit diagram showing the measurement device of the reverse recovery charge according to the embodiment.

In the measurement device 6 of the reverse recovery charge according to the embodiment as shown in FIG. 14, the variable inductance 15 is located between a node 17 and the source of the semiconductor element 101. The node 17 is the connection point between the source of the semiconductor element 101, the fixed inductance 13, and the resistance element 14. Otherwise, the configuration, the method, and the effects according to the embodiment are similar to those of the first embodiment.

Seventh Embodiment

The position at which the variable inductance is located in the measurement device according to the embodiment is different from that of the first embodiment.

Figure 15:
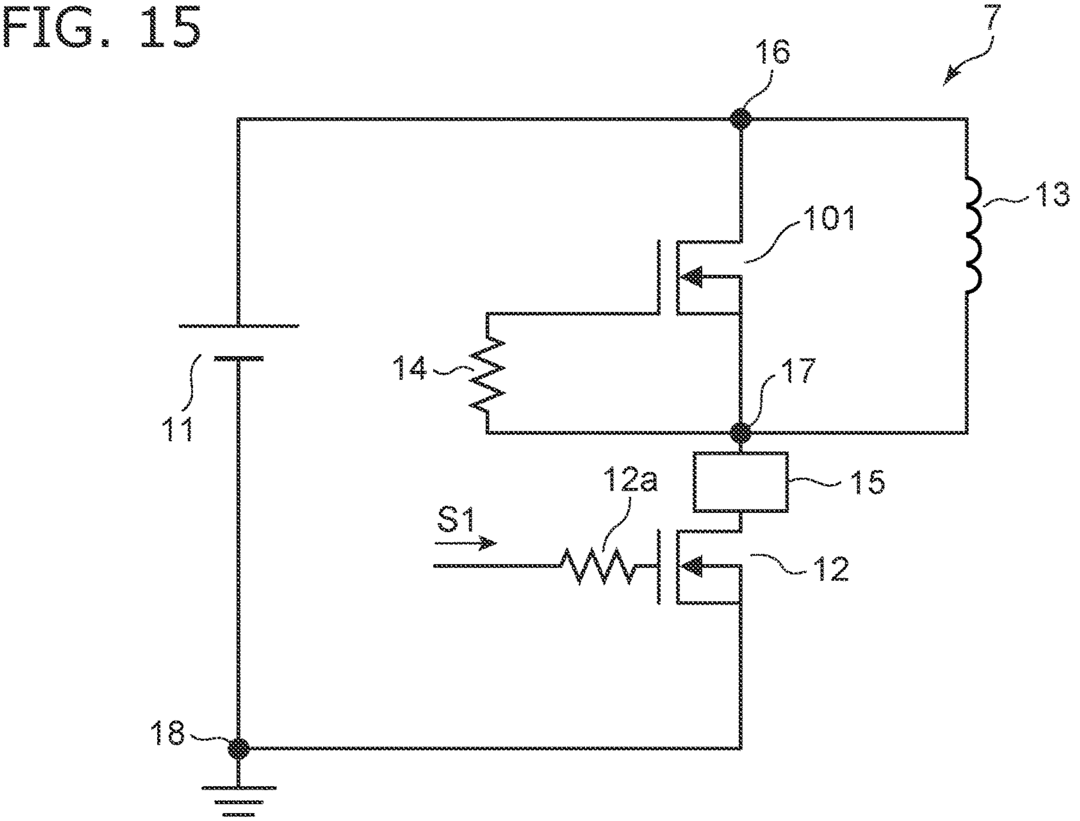
FIG. 15 is a circuit diagram showing the measurement device of the reverse recovery charge according to a seventh embodiment.

FIG. 15 is a circuit diagram showing the measurement device of the reverse recovery charge according to the embodiment.

In the measurement device 7 of the reverse recovery charge according to the embodiment as shown in FIG. 15, the variable inductance 15 is located between the node 17 and the drain of the switching element 12. Otherwise, the configuration, the method, and the effects according to the embodiment are similar to those of the first embodiment.

Eighth Embodiment

The position at which the variable inductance is located in the measurement device according to the embodiment is different from that of the first embodiment.

Figure 16:
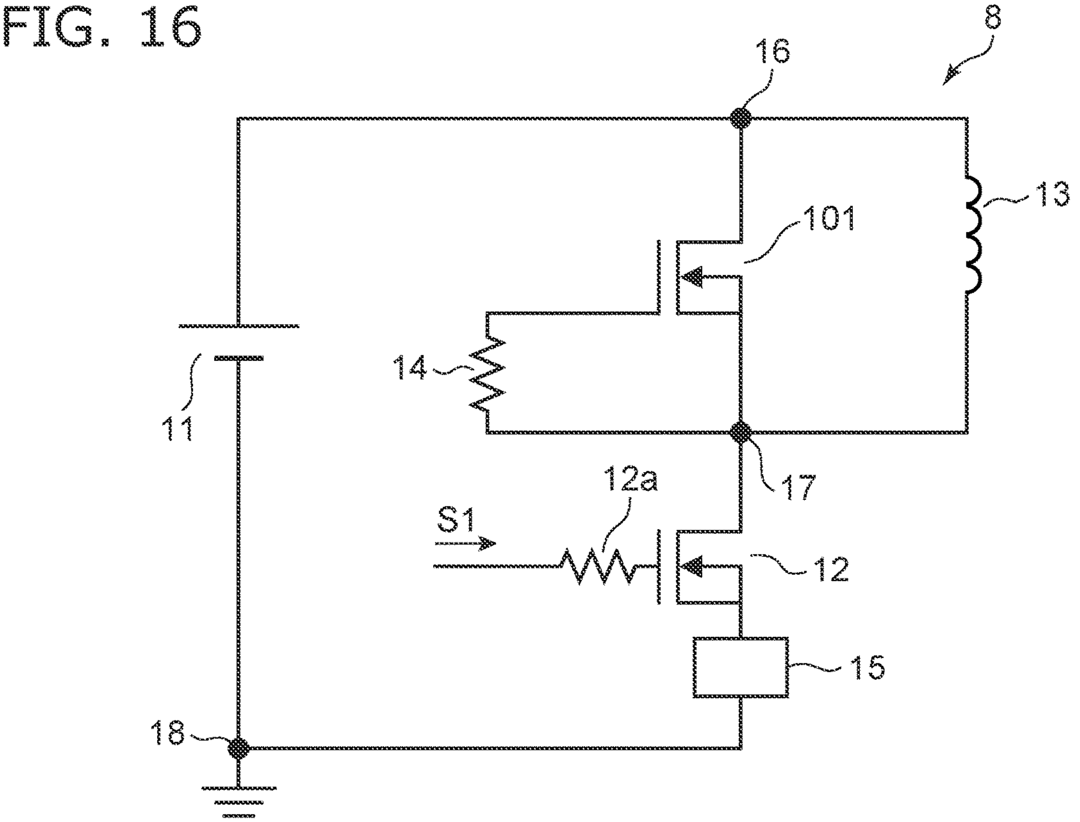
FIG. 16 is a circuit diagram showing the measurement device of the reverse recovery charge according to an eighth embodiment.

FIG. 16 is a circuit diagram showing the measurement device of the reverse recovery charge according to the embodiment.

In the measurement device 8 of the reverse recovery charge according to the embodiment as shown in FIG. 16, the variable inductance 15 is located between a node 18 and the source of the switching element 12. The node 18 is the connection point between the source of the switching element 12, the anode of the DC power supply 11, and the ground potential GND.

According to the embodiment, there is a possibility that the current caused by the variable inductance 15 may flow into the switching element 12 and hinder the operation of the switching element 12. For example, the turn-on of the switching element 12 may be delayed from the timing defined by the control signal S1 and the resistance 12*a*; and the current change rate di/dt may fluctuate. However, this phenomenon can be handled by correcting the control signal S1 or the resistance 12*a*. Otherwise, the configuration, the method, and the effects according to the embodiment are similar to those of the first embodiment.

Ninth Embodiment

The position at which the variable inductance is located in the measurement device according to the embodiment is different from that of the first embodiment.

Figure 17:
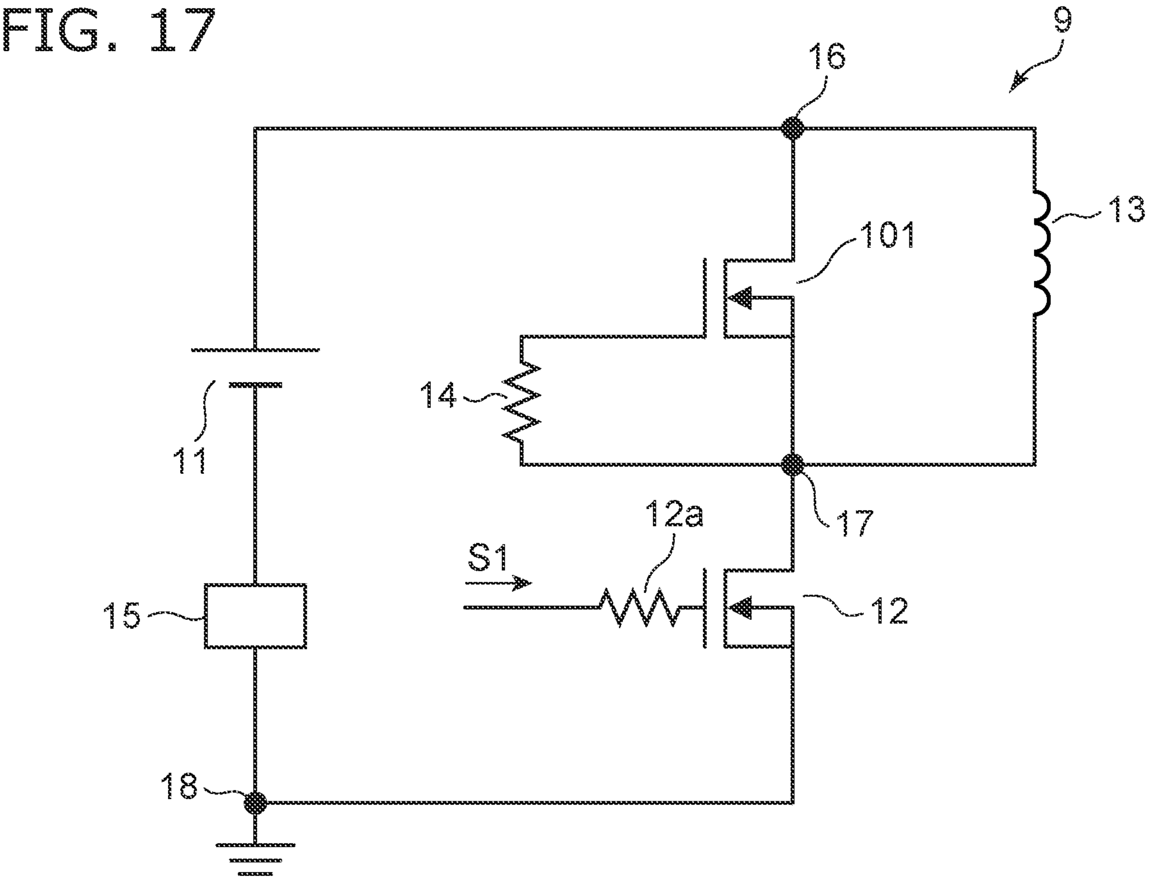
FIG. 17 is a circuit diagram showing the measurement device of the reverse recovery charge according to a ninth embodiment.

FIG. 17 is a circuit diagram showing the measurement device of the reverse recovery charge according to the embodiment.

In the measurement device 9 of the reverse recovery charge according to the embodiment as shown in FIG. 17, the variable inductance 15 is located between the node 18 and the anode of the DC power supply 11. Otherwise, the configuration, the method, and the effects according to the embodiment are similar to those of the first embodiment.

Although the semiconductor element 101 that is the measurement object in the examples according to the embodiments described above is a vertical MOSFET such as that shown in FIG. 2, the invention is not limited thereto; it is sufficient to be a semiconductor element that includes a diode component. For example, a vertical MOSFET that does not include the FP electrode 124 may be used.

According to the embodiments described above, a measurement method and a measurement device can be realized in which the reverse recovery charge of the semiconductor element can be accurately measured.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Additionally, the embodiments described above can be combined mutually.

Embodiments include the following aspects.

Note 1

A measurement method, comprising:

determining a first relationship by measuring a reverse recovery charge of a semiconductor element at a plurality of conditions of a measurement device, the measurement device having mutually-different parasitic inductances at the plurality of conditions, the semiconductor element including a diode component, the first relationship being between the parasitic inductance and a measured value of the reverse recovery charge; and estimating a true value of the reverse recovery charge when the parasitic inductance is zero based on the first relationship.

Note 2

The method according to note 1, wherein the estimating of the true value of the reverse recovery charge includes:

determining a second relationship and a third relationship at the plurality of conditions of the measurement device having mutually-different parasitic inductances, the second relationship being between a current change rate and a charge transferred in an initial half period of a current oscillation, the third relationship being between the current change rate and a charge transferred in an entire duration of the current oscillation;

setting a saturated current change rate as the current change rate at an intersection of the second and third relationships in a graph illustrating a relationship between the current change rate and the charge;

determining a fourth relationship between the saturated current change rate and the parasitic inductance;

setting a saturated parasitic inductance by determining the parasitic inductance corresponding to an arbitrary value of the saturated current change rate based on the fourth relationship; and setting the true value as the charge corresponding to the saturated parasitic inductance based on the first relationship.

Note 3

The method according to note 2, further comprising:

determining the true value corresponding to an arbitrary value of the current change rate based on a fifth relationship between the saturated current change rate and the true value at the plurality of conditions of the measurement device having mutually-different parasitic inductances.

Note 4

The method according to note 1, wherein the estimating of the true value of the reverse recovery charge includes:

determining a second relationship between a current change rate and a surge voltage at the plurality of conditions of the measurement device having mutually-different parasitic inductances;

setting a saturated current change rate as the current change rate corresponding to a reference potential in the second relationship, the reference potential being set between an anode potential and a cathode potential of a power supply;

determining a third relationship between the saturated current change rate and the parasitic inductance;

setting a saturated parasitic inductance by determining the parasitic inductance corresponding to an arbitrary value of the saturated current change rate based on the third relationship; and setting the true value as the charge corresponding to the saturated parasitic inductance based on the first relationship.

Note 5

The method according to note 4, further comprising:

determining the true value corresponding to an arbitrary value of the current change rate based on a fifth relationship between the saturated current change rate and the true value at the plurality of conditions of the measurement device having mutually-different parasitic inductances.

Note 6

The method according to note 1, wherein the estimating of the true value of the reverse recovery charge includes:

determining a second relationship and a third relationship at the plurality of conditions of the measurement device having mutually-different parasitic inductances, the second relationship being between a current change rate and a charge transferred in an initial half period of a current oscillation, the third relationship being between the current change rate and a charge transferred in an entire duration of the current oscillation; and setting a saturated current change rate as the current change rate at an intersection of the second and third relationships in a graph illustrating a relationship between the current change rate and the charge, and setting the true value as a charge at the intersection.

Note 7

The method according to note 6, further comprising:

determining the true value corresponding to an arbitrary value of the current change rate based on a fourth relationship between the saturated current change rate and the true value at the plurality of conditions of the measurement device having mutually-different parasitic inductances.

Note 8

The method according to any one of notes 1-7, wherein the semiconductor element is a field-effect transistor, and the method further comprises:

measuring an output charge amount of the semiconductor element; and determining a difference by subtracting the measured output charge amount from the true value.

Note 9

The method according to note 8, wherein the output charge amount is estimated to be a charge contributing to a boost of a drain-source voltage of the semiconductor element, and the difference is estimated to be a charge caused by recombination and discharge of carriers in the semiconductor element.

Note 10

A measurement device, comprising:

a direct current power supply connected to a semiconductor element, the semiconductor element including a diode component;

a switching element connected in series to the direct current power supply and the semiconductor element;

a fixed inductance connected in parallel to the semiconductor element; and a variable inductance connected in series with a semiconductor element in a circuit, the circuit including the direct current power supply, the semiconductor element, and the switching element.

What is claimed is:

1. A measurement method for measuring a reverse recovery charge of a semiconductor element including a diode component, comprising:

using a measurement device in which a direct-current power supply, a variable inductance, and a switching element are connected in series with a semiconductor element including a diode component, and, at a plurality of conditions in which a parasitic inductance of the measurement device is made mutually different by setting the variable inductance and a current change rate of a current flowing through the semiconductor element is set to an identical value by adjusting a value of a resistance connected to a control electrode of the switching element, acquiring, at each condition, a drain-source current waveform of the semiconductor element and calculating, as a reverse recovery charge, a time integral of a reverse recovery current over an entire duration of current oscillations;

based on the parasitic inductance and measured values of the reverse recovery charge, determining, at the identical current change rate, a first relationship between the parasitic inductance and the measured values of the reverse recovery charge;

determining a second relationship and a third relationship at the plurality of conditions of the measurement device having mutually-different parasitic inductances, the second relationship being between a current change rate and a charge transferred in an initial half period of a current oscillation, the third relationship being between the current change rate and a charge transferred in an entire duration of the current oscillation;

setting a saturated current change rate as the current change rate at an intersection of the second and third relationships in a graph illustrating a relationship between the current change rate and the charge;

determining a fourth relationship between the saturated current change rate and the parasitic inductance;

setting a saturated parasitic inductance by determining the parasitic inductance corresponding to an arbitrary value of the saturated current change rate based on the fourth relationship; and setting a true value as the charge corresponding to the saturated parasitic inductance based on the first relationship.

2. The method according to claim 1, further comprising:

determining the true value corresponding to an arbitrary value of the current change rate based on a fifth relationship between the saturated current change rate and the true value at the plurality of conditions of the measurement device having mutually-different parasitic inductances by plotting pairs of the saturated current change rate and the true value determined for the respective conditions.

3. The method according to claim 1, wherein the semiconductor element is a field-effect transistor, and the method further comprises:

measuring an output charge amount of the semiconductor element; and determining a difference by subtracting the measured output charge amount from the true value.

4. The method according to claim 3, wherein the output charge amount is estimated to be a charge contributing to a boost of a drain-source voltage of the semiconductor element, and the difference is estimated to be a charge caused by recombination and discharge of carriers in the semiconductor element.

5. A measurement method for measuring a reverse recovery charge of a semiconductor element including a diode component, comprising:

using a measurement device in which a direct-current power supply, a variable inductance, and a switching element are connected in series with a semiconductor element including a diode component, and, at a plurality of conditions in which a parasitic inductance of the measurement device is made mutually different by setting the variable inductance and a current change rate of a current flowing through the semiconductor element is set to an identical value by adjusting a value of a resistance connected to a control electrode of the switching element, acquiring, at each condition, a drain-source current waveform of the semiconductor element and calculating, as a reverse recovery charge, a time integral of a reverse recovery current over an entire duration of current oscillations;

based on the parasitic inductance and measured values of the reverse recovery charge, determining, at the identical current change rate, a first relationship between the parasitic inductance and the measured values of the reverse recovery charge;

determining a second relationship between a current change rate and a surge voltage at the plurality of conditions of the measurement device having mutually-different parasitic inductances;

setting a saturated current change rate as the current change rate corresponding to a reference potential in the second relationship, the reference potential being set between an anode potential and a cathode potential of a power supply;

determining a third relationship between the saturated current change rate and the parasitic inductance;

setting a saturated parasitic inductance by determining the parasitic inductance corresponding to an arbitrary value of the saturated current change rate based on the third relationship; and setting the true value as the charge corresponding to the saturated parasitic inductance based on the first relationship.

6. The method according to claim 5, further comprising:

determining the true value corresponding to an arbitrary value of the current change rate based on a fourth relationship between the saturated current change rate and the true value at the plurality of conditions of the measurement device having mutually-different parasitic inductances.

7. A measurement method for measuring a reverse recovery charge of a semiconductor element including a diode component, comprising:

using a measurement device in which a direct-current power supply, a variable inductance, and a switching element are connected in series with a semiconductor element including a diode component, and, at a plurality of conditions in which a parasitic inductance of the measurement device is made mutually different by setting the variable inductance and a current change rate of a current flowing through the semiconductor element is set to an identical value by adjusting a value of a resistance connected to a control electrode of the switching element, acquiring, at each condition, a drain-source current waveform of the semiconductor element and calculating, as a reverse recovery charge, a time integral of a reverse recovery current over an entire duration of current oscillations;

based on the parasitic inductance and measured values of the reverse recovery charge, determining, at the identical current change rate, a first relationship between the parasitic inductance and the measured values of the reverse recovery charge;

determining a second relationship and a third relationship at the plurality of conditions of the measurement device having mutually-different parasitic inductances, the second relationship being between a current change rate and a charge transferred in an initial half period of a current oscillation, the third relationship being between the current change rate and a charge transferred in an entire duration of the current oscillation; and setting a saturated current change rate as the current change rate at an intersection of the second and third relationships in a graph illustrating a relationship between the current change rate and the charge, and setting the true value as a charge at the intersection.

8. The method according to claim 7, further comprising:

determining the true value corresponding to an arbitrary value of the current change rate based on a fourth relationship between the saturated current change rate and the true value at the plurality of conditions of the measurement device having mutually-different parasitic inductances.

* * * * *